US011315969B2

(12) United States Patent
Tian et al.

(10) Patent No.: US 11,315,969 B2
(45) Date of Patent: Apr. 26, 2022

(54) BURIED TRI-GATE FIN VERTICAL GATE STRUCTURE AND METHOD FOR MAKING THE SAME

(71) Applicant: SHANGHAI HUALI INTEGRATED CIRCUIT CORPORATION, Shanghai (CN)

(72) Inventors: Zhi Tian, Shanghai (CN); Juanjuan Li, Shanghai (CN); Hua Shao, Shanghai (CN); Haoyu Chen, Shanghai (CN)

(73) Assignee: SHANGHAI HUALI INTEGRATED CIRCUIT CORPORATION, Shanghai (CN)

( * ) Notice: Subject to any disclaimer, the term of this patent is extended or adjusted under 35 U.S.C. 154(b) by 76 days.

(21) Appl. No.: 16/943,468

(22) Filed: Jul. 30, 2020

(65) Prior Publication Data

US 2021/0305297 A1  Sep. 30, 2021

(30) Foreign Application Priority Data

Mar. 24, 2020 (CN) .......................... 202010212575.5

(51) Int. Cl.
*H01L 27/146* (2006.01)

(52) U.S. Cl.
CPC .. *H01L 27/14614* (2013.01); *H01L 27/14645* (2013.01); *H01L 27/14689* (2013.01)

(58) Field of Classification Search
None
See application file for complete search history.

(56) References Cited

U.S. PATENT DOCUMENTS

| 2013/0221410 | A1* | 8/2013 | Ahn | H01L 27/14614 257/225 |
| 2015/0155328 | A1* | 6/2015 | Park | H01L 27/14645 250/208.1 |
| 2016/0049429 | A1* | 2/2016 | Lee | H01L 27/14614 257/231 |
| 2016/0056199 | A1* | 2/2016 | Kim | H01L 27/14623 250/208.1 |
| 2016/0111461 | A1* | 4/2016 | Ahn | H01L 27/1464 250/208.1 |

* cited by examiner

*Primary Examiner* — Ali Naraghi
(74) *Attorney, Agent, or Firm* — Alston & Bird LLP (57) ABSTRACT

The present application provides a buried tri-gate fin vertical gate structure. Which includes a transfer transistor on an epitaxial layer; a photodiode in the epitaxial layer at one side of the transfer transistor. A reset transistor on the epi-layer includes N+ regions at both sides of its gate, one of the N+ regions forms a floating diffusion node. The bottom of the fin vertical gate protrudes into the epitaxial layer with a number of vertical portions. Thus, increased surface areas enhance charge motion at the bottom, combining large-area transfer at an upper layer by the vertical gate and quick transfer at the bottom by the FINFET, thereby improving photo response.

12 Claims, 6 Drawing Sheets

BURIED TRI-GATE FIN VERTICAL GATE STRUCTURE AND METHOD FOR MAKING THE SAME

CROSS-REFERENCES TO RELATED APPLICATIONS

This application claims priority to Chinese patent application No. CN202010212575.5, filed on Mar. 24, 2020 at CNIPA, and entitled "BURIED TRI-GATE FIN VERTICAL GATE STRUCTURE AND METHOD FOR MAKING THE SAME", the disclosure of which is incorporated herein by reference in entirety.

TECHNICAL FIELD

The present application relates to the field of semiconductor devices, in particular to a buried tri-gate fin vertical gate structure.

BACKGROUND

CMOS image sensors have been developed rapidly in the past decades, and they are now widely applied to fields such as mobile phones, computers, and digital cameras. To satisfy the market demands for higher pixel unit density, pixel dimensions of CMOS image sensors have been gradually reduced from 5.6 mm each to <1.0 mm each. However, due to limitations on the effective full well capacity (FWC) of the photodiodes in the CMOS image sensors, reduction in pixel sizes involves more than the simple size reduction of all dimensions of photodiodes. The reason for that is that when photodiode' sizes are too small, they cannot store sufficient electrons, thereby degrading image quality severely.

Figure 1:
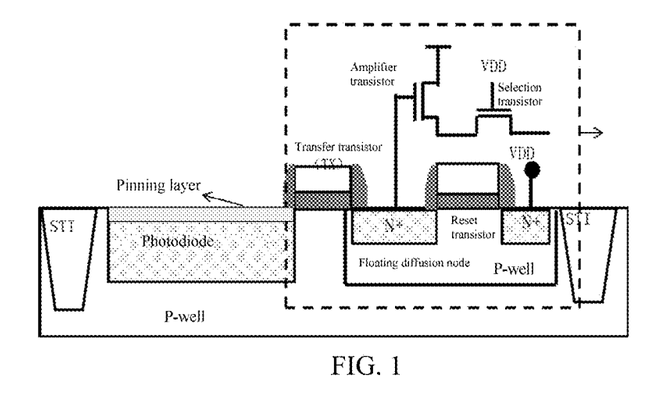
FIG. 1 illustrates a schematic view of a circuit structure of an existing pixel unit.
Figure 2:
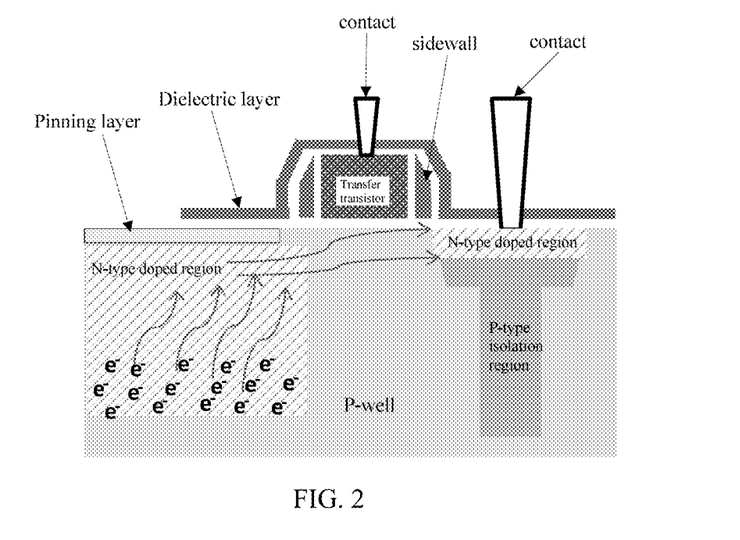
FIG. 2 illustrates a structural view of an existing planar four-pixel unit.
Figure 3:
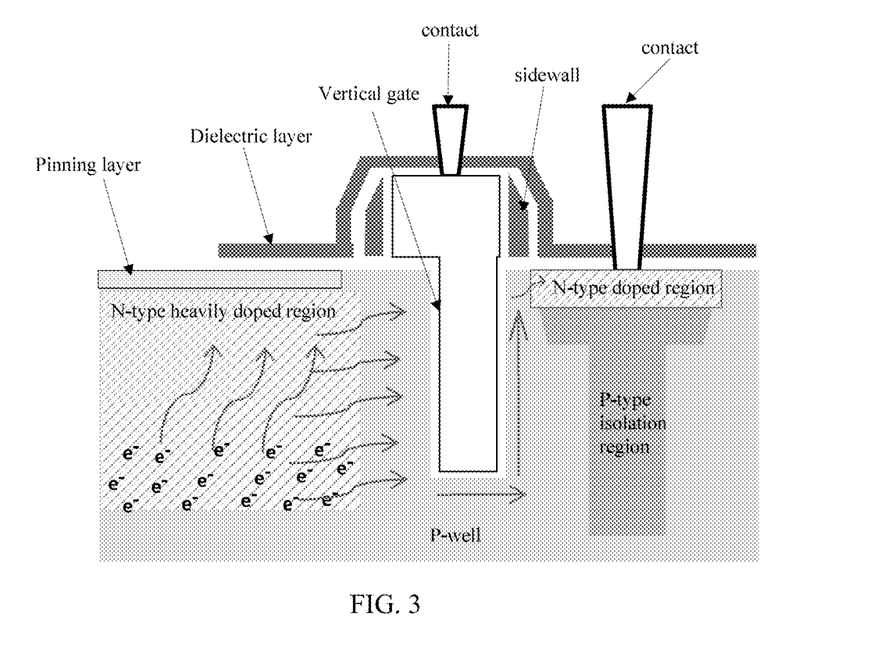
FIG. 3 illustrates a schematic structural view of an existing vertical four-pixel unit.
Figure 4:
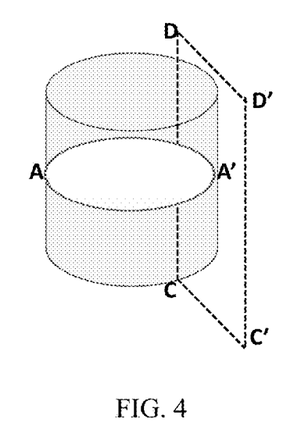
FIG. 4 illustrates a schematic view of a three-dimensional structure of a small-sized vertical gate.
Figure 5:
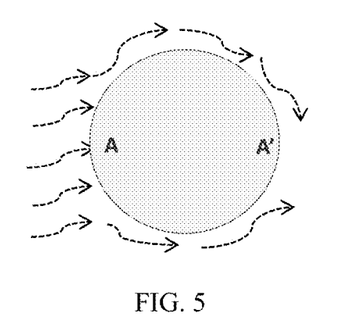
FIG. 5 illustrates the electron movement in an equal potential plane AA' of the vertical gate in FIG. 4.
Figure 6:
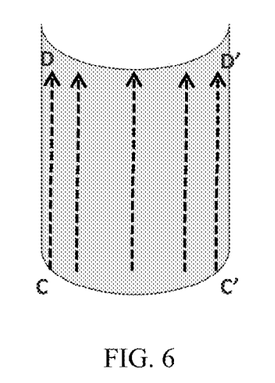
FIG. 6 illustrates the electron movement in a regional plane CC'D'D of a floating diffusion node of the gate structure in FIG. 4.

The basic construction of a typical conventional 4 T (4 transistors) CMOS image sensor is as shown in FIG. 1. The image sensor consists of a photodiode (PD), a transfer transistor (TX), a reset transistor (RST), an amplifier, and a selection transistor for rows. When the TX is closed to perform the photosensitizing process, the PN junction in the photodiode captures sunlight to generate electrons and holes. The photo-generated electrons accumulate at the top of the PN junction under the built-in electric field in the PN junction, and transmit to the floating diffusion region via the surface channel when the transfer gate of TX is open, the charges passing the TX transfer gate are read. The transfer path of the electrons is shown in FIG. 2. The electron transmission path is relatively short, and the electrons deep from top surface in the photodiode need to transmit through the entire junction region, so the recombination with holes is more likely to occur, resulting in low extraction efficiency. Moreover, the transmission of electrons deep in the P-N junction of the photodiode requires a voltage for driving and takes a certain time to complete, this is not conducive to quick charge reading. In order to increase the reaction speed and efficiency of electron transfers, a three-dimensional pixel region is developed to replace the conventional two-dimensional channel structure, as an effective way to solve the slow reaction problem. FIG. 3 shows that a vertical gate built next to the photodiode can extend the TX gate channel deep into the photodiode. FIGS. 4, 5, and 6 show that electrons move in the equal-potential plane AA' and the regional surface CC'D'D of the floating diffusion node. In the same potential plane AA of FIG. 5, it is not easy for the electrons to accumulate near the floating diffusion node. In FIG. 6, the electron density is even in the entire regional surface CC'D'D of the floating diffusion node, thus the transfer speed is relatively low. As the electron transmission channel changes from a planar channel to a three-dimensional curved channel, transmission area is enlarged, thus the transmission rate of the photo-electrons is increased significantly. The extension of the channel can also reduce the unpaired electrons in the diode and improve the utilization of photoelectrons, ultimately improving the full well capacity of the photodiode. However, the top surface electric field is relatively stronger than that at bottom, transfer of electrons near the surface starts earlier than the lower electrons, the transfer time of the bottom electrons increases from a weaker local electric field, thereby the overall response speed averaging all electrons is slowed down. So the impact on a backside-illuminated (BSI) small pixel unit is particularly prominent.

A solution to overcome these defects is needed.

BRIEF SUMMARY

According to one embodiment of the current disclosure, the tri-gate vertical gate structure comprises: a transfer transistor disposed on an epitaxial layer, wherein the transfer transistor comprises a vertical gate, wherein the vertical gate comprises a bottom structure including a plurality of protruding portions stretching into the epitaxial layer; a photodiode located laterally at one side of the transfer transistor and disposed at a depth inside the epitaxial layer, wherein the vertical gate of the transfer transistor extends to the depth of the photodiode; and a reset transistor disposed on the epitaxial layer at another side of the transfer transistor opposite to the photodiode, wherein the epitaxial layer comprises a P-doped well between the transfer transistor and the reset transistor, wherein the reset transistor comprises a gate, N+-doped regions in the epitaxial layer at both sides of the reset transistor gate, wherein one of the N+-doped regions between the transfer transistor and the reset transistor is located in the P-doped well, and wherein said N+-doped region forms a floating diffusion node.

In some examples, a vertical cross section of each of the plurality of protruding portions into the epitaxial layer forms a shape like a letter "n".

In some examples, each of the plurality of protruding portions into the epitaxial layer has a length in a range of ⅓ to ½ of a length of the vertical gate disposed in the vertical direction in the epitaxial layer.

In some examples, the vertical gate in the epitaxial layer forms a shape of a cuboid column, and wherein one of the four protruding portions is placed vertical.

In some examples, the vertical gate of the transfer transistor has a sidewall next to the epitaxial layer.

In some examples, the N+-doped region forming the floating diffusion node is connected to an amplifier transistor, wherein the amplifier transistor is connected to a selection transistor, wherein a gate of the selection transistor is connected to a voltage VDD, and wherein one of the N+-doped regions located at another side of the reset transistor is connected to the voltage VDD.

According to another embodiment, a method to make the vertical gate comprises the following steps:

step 1: providing the epitaxial layer, and forming the P-doped well and the two laterally spaced N+ regions in the P-doped well;

step 2: forming the photodiode in the epitaxial layer, and forming the floating diffusion node in one of the N+-doped regions which is at the side of the transfer transistor opposite to the side of the photodiode;

step 3: forming a vertical gate trench of the transfer transistor in the epitaxial layer between the photodiode and the floating diffusion node by means of etching, wherein a depth of the vertical gate trench extends to the depth where the photodiode is located, and wherein the vertical gate comprises the bottom structure including two protruding portions stretching into the epitaxial layer;

step 4: depositing a layer of polysilicon on the epitaxial layer into the vertical gate trench; and step 5: patterning the layer of polysilicon to form the vertical gate of the transfer transistor between the photodiode and the floating diffusion node, and patterning the gate of the reset transistor between the two N+-doped regions.

In some examples, in step 1, the P-doped well is formed by sequentially performing photolithography, etching, and ion implantation; and wherein the two N+-doped regions are formed by sequentially performing photolithography, etching, and N-type ion implantation.

In some examples, in step 2, the photodiode is formed by sequentially performing photolithography, etching, and ion implantation.

In some examples, the method further comprises step 6: performing ion implantation in the epitaxial layer on the photodiode to form a pinning layer.

In some examples, in step 3, the vertical cross section of the two protruding portions into the epitaxial layer forms a shape like a letter "n".

In some examples, step 3 further comprises etching the vertical gate trench into the epi-layer to have the length in the range of ⅓ to ½ of the length of the vertical gate disposed in the vertical direction in the epitaxial layer.

DETAILED DESCRIPTION OF THE DISCLOSURE

The embodiments of the present application are described below by means of specific examples, and those skilled in the art can easily understand other advantages and effects of the present application from the contents disclosed in the description. The present application can also be implemented or applied via other different specific embodiments. Various details in the description can also be modified or changed based on different viewpoints and applications, without departing from the spirit of the present application.

It should be noted that the drawings provided in this embodiment illustrate the basic concept of the present disclosure in a schematic manner only, and the components related to the present disclosure are shown in the drawings, without being drawn according to the numbers, shapes, and sizes of the components in actual implementation. The type, number, and scale of each component can be changed at random during the actual implementation, and the component layout type may be more complicated.

Figure 7:
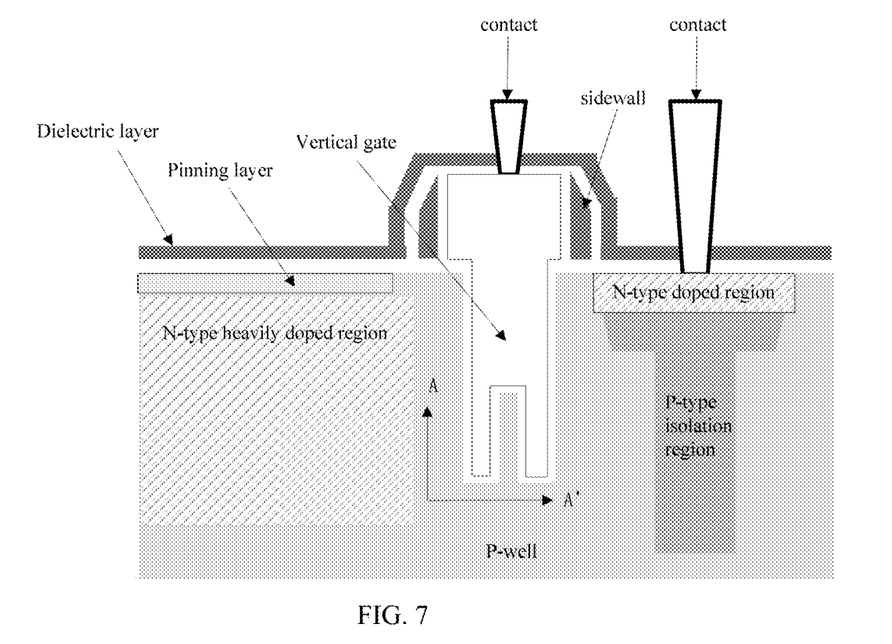
FIG. 7 illustrates a cross sectional view of a buried tri-gate fin vertical gate structure according to some embodiment of the present disclosure.
Figure 9:
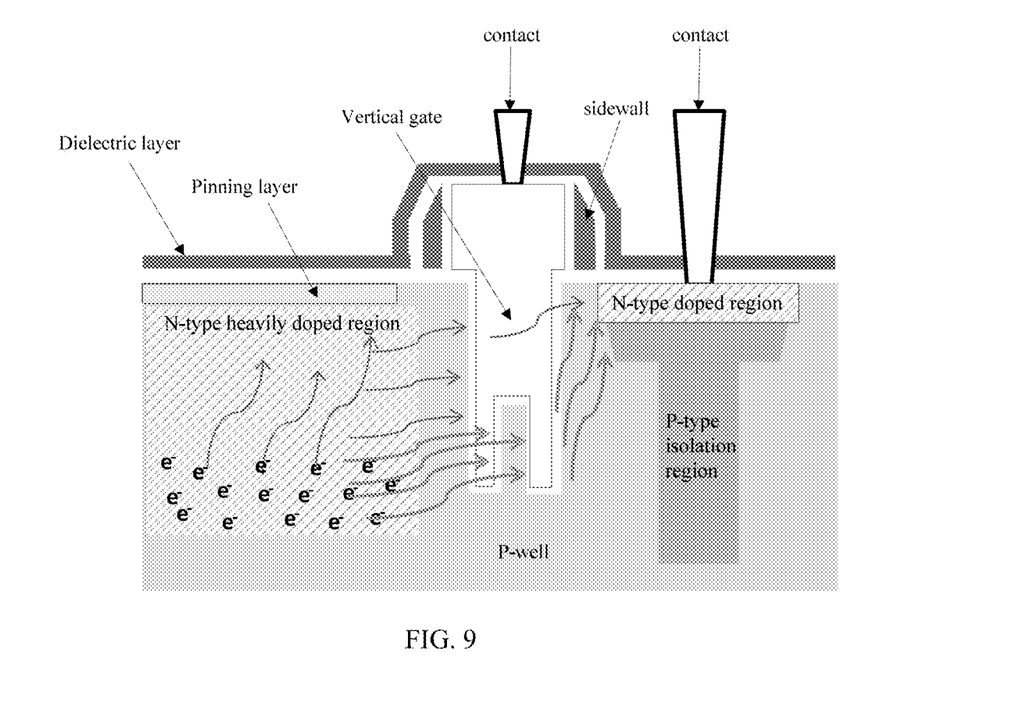
FIG. 9 illustrates a schematic view of the electron transfer in a buried tri-gate fin vertical gate structure according to one embodiment of the present disclosure.

FIGS. 7- and 9 illustrate a vertical gate structure according to some embodiment of the current disclosure. FIG. 7 illustrates the cross sectional view of the buried tri-gate fin vertical gate structure, which includes at least: a transfer transistor on an epitaxial layer; a photodiode at one side of the transfer transistor in the epitaxial layer. The epitaxial layer is a P-type epitaxial layer, a vertical gate of the transfer transistor stretches into the epitaxial layer and extends to the depth at which the photodiode is located; and a reset transistor on the epitaxial layer at the other side of the transfer transistor, wherein N+ regions are respectively provided in the epitaxial layer at both sides of a gate of the reset transistor, the N+ region is located in a P-well of the epitaxial layer, one of the N+ regions which is adjacent to the transfer transistor forms a floating diffusion node. A lower end of the vertical gate has a structure with four protruding sections like four legs inserted into the epitaxial layer.

In an example of the present disclosure, vertical cross sections of the vertical gates in two perpendicular planes form the shape of letter "n". The structure of the vertical gate in the epitaxial layer has the shape of a cuboid column. As shown in FIG. 7, the plane of AA' contains one of the vertical cross sections of the vertical gate, and another vertical plane is perpendicular to the plane of AA'.

In an example of the present disclosure, the horizontal width of the lower end structure of the vertical gate is ½ to ⅓ of the length of the vertical gate in the epitaxial layer. Electron transfer at the bottom is improved by means of conduction between three surfaces at the bottom of the vertical gate, thereby effectively improves photo-response time.

In an example of the present disclosure, a pinning layer is provided on an upper surface of the photodiode. In an example, a portion on the epitaxial layer of the vertical gate of the transfer transistor is provided with a sidewall. The N+ region on the floating diffusion node is connected to an amplifier transistor, the amplifier transistor is connected to a selection transistor, a gate of the selection transistor is connected to a voltage VDD, and the N+ region at the other side of the reset transistor is connected to the voltage VDD.

The present application further provides a method for manufacturing the buried tri-gate fin vertical gate structure, and the method includes at least the following steps:

Step 1: An epitaxial layer is provided, and a P-well and two laterally spaced N+ regions in the P-well are formed. In an example of the present application, in step 1, the P-well is formed by sequentially performing photolithography, etching, and ion implantation, and the two N+ regions are formed by sequentially performing photolithography, etching, and N-type ion implantation.

Step 2: A photodiode is formed in the epitaxial layer, and a floating diffusion node is formed from one of the N+ region which is adjacent to the transfer transistor. In an example of the present application, in step 2, the photodiode is formed by sequentially performing photolithography, etching, and ion implantation.

Step 3: A vertical gate trench of a transfer transistor is formed in an epitaxial layer between the photodiode and the floating diffusion node by means of etching, wherein the depth of the vertical gate trench extends to the depth at which the photodiode is located, and a lower end of the vertical gate trench is a structure of two longitudinal sections perpendicular to each other resulting from the epitaxial layer penetrating through the vertical gate trench. In an example of the present application, the cross section of the two vertical cross sections perpendicular to each other at the lower end of the vertical gate trench formed in step 3 is an n-shape. In another example, the longitudinal width of the lower end structure of the vertical gate trench formed by means of etching in step 3 is ½ to ⅓ of the length of the vertical gate trench in the epitaxial layer. The structure of the vertical gate trench of the present application in the epitaxial layer has the shape of a cuboid column, and one of the two longitudinal sections perpendicular to each other is parallel to a longitudinal surface of the vertical gate trench. As shown in FIG. 7, the plane of AA' is parallel to a vertical surface of the vertical gate trench in the shape of a cuboid column.

Step 4: Polysilicon is deposited on the epitaxial layer, and the vertical gate trench is filled with the polysilicon.

Step 5: The polysilicon on the epitaxial layer is etched to form a vertical gate of the transfer transistor between the photodiode and the floating diffusion node, and a gate of the reset transistor between the two N+ regions.

In an example of the present disclosure, the method further includes step 6: ion implantation is performed in the epitaxial layer on the photodiode to form a pinning layer.

Figure 8:
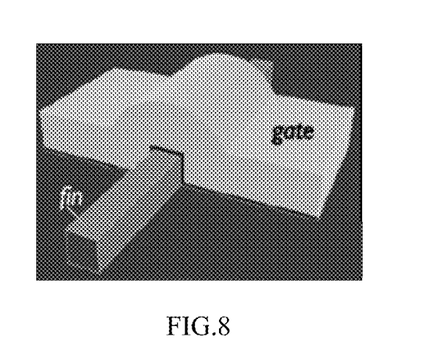
FIG. 8 illustrates a schematic view of a three-dimensional structure of an existing tri-gate.

FIG. 8 illustrates a three-dimensional structure of an existing tri-gate. FIG. 9 illustrates a schematic view of electron transfer of the buried tri-gate fin vertical gate structure of the present disclosure. By comparing the electron transfer in the vertical gate shown in FIG. 9 with the existing device, the conduction between three surfaces can be formed at the bottom when a voltage is applied to the vertical gate, achieving large-area transfer at an upper layer by means of the vertical gate, which is conducive to effective and quick transfer of electrons, thereby improving photo-response.

Figure 10:
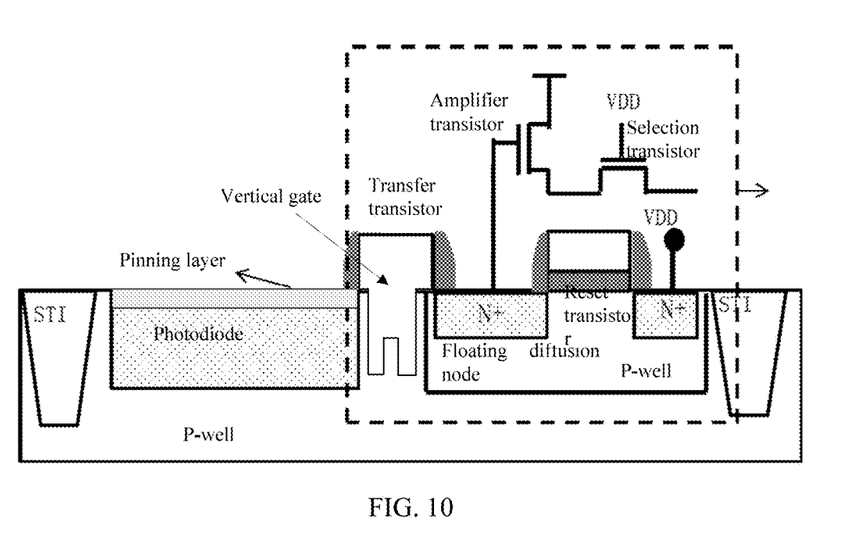
FIG. 10 illustrates the schematic view of the pixel unit circuit in a CMOS image sensor which has the vertical gate, according to one embodiment of the present disclosure.

FIG. 10 illustrates the schematic view of the pixel unit circuit in a CMOS image sensor which has the vertical gate, according to one embodiment of the present disclosure. The circuit has four transistors. The image sensor includes a photodiode, a transfer transistor with the vertical gate as described above, a reset transistor, an amplifier transistor, and a selection transistor for row selection. When the a transfer transistor is closed to perform the photosensitizing process, the photodiode PN junction captures external light and electrons and holes are generated. The photo-generated electrons then accumulate at the top of the PN junction under the built-in electric field in the PN junction, and eventually transmit to the floating diffusion region via the surface channel when the vertical transfer gate of transfer transistor is open, to let the charges pass the transfer transistor's gate to be read. With the open bottom structure of the vertical transfer gate, more electrons can pass through the open hollow gate bottom in the epitaxial layer. Therefore, the electron transfer is faster and more efficient.

In conclusion, the vertical gate structure of the buried tri-gate fin structure of the present disclosure is formed at the bottom by means of process integration, to improve electron transfer at the bottom, that is, conduction between three surfaces can be formed at the bottom of the tri-gate when a voltage is applied to the vertical gate, forming an effective combination of performing large-area transfer at an upper layer by means of the vertical gate and performing quick transfer at the bottom by means of a FINFET, which is conducive to effective and quick transfer of electrons, thereby improving photo-response. Therefore, the present disclosure effectively overcomes identified shortcomings in the existing structures, resulting in high benefit when utilized in industry.

It should be understood that the examples and embodiments described herein are for illustrative purposes only and that various modifications or changes in light thereof will be suggested to persons skilled in the art and are to be included within the spirit and purview of this application.

What is claimed is:

1. A buried tri-gate fin vertical gate structure, comprising at least:

a transfer transistor disposed on an epitaxial layer, wherein the transfer transistor comprises a vertical gate, wherein the vertical gate comprises a bottom structure including a plurality of protruding portions stretching into the epitaxial layer;

a photodiode located laterally at one side of the transfer transistor and disposed at a depth inside the epitaxial layer, wherein the vertical gate of the transfer transistor extends to the depth of the photodiode; and a reset transistor disposed on the epitaxial layer at another side of the transfer transistor opposite to the photodiode, wherein the epitaxial layer comprises a P-doped well between the transfer transistor and the reset transistor, wherein the reset transistor comprises a gate, N+-doped regions in the epitaxial layer at both sides of the reset transistor gate, wherein one of the N+-doped regions between the transfer transistor and the reset transistor is located in the P-doped well, and wherein said N+-doped region forms a floating diffusion node.

2. The buried tri-gate fin vertical gate structure according to claim 1, wherein a number of the plurality of protruding portions is four, and wherein a vertical cross section of the plurality of protruding portions into the epitaxial layer forms a shape like a letter "n".

3. The buried tri-gate fin vertical gate structure according to claim 2, wherein the vertical gate in the epitaxial layer forms a shape of a cuboid column, and wherein one of the four protruding portions is placed vertical.

4. The buried tri-gate fin vertical gate structure according to claim 1, wherein each of the plurality of protruding portions into the epitaxial layer has a length in a range of ⅓ to ½ of a length of the vertical gate disposed in a vertical direction in the epitaxial layer.

5. The buried tri-gate fin vertical gate structure according to claim 1, wherein the vertical gate of the transfer transistor has a sidewall next to the epitaxial layer.

6. The buried tri-gate fin vertical gate structure according to claim 1, wherein the N+-doped region forming the floating diffusion node is connected to an amplifier transistor, wherein the amplifier transistor is connected to a selection transistor, wherein a gate of the selection transistor is connected to a voltage VDD, and wherein one of the N+-doped regions located at another side of the reset transistor is connected to the voltage VDD.

7. A method for manufacturing the buried tri-gate fin vertical gate structure according to claim 1, wherein the method comprises following steps:

step 1: providing the epitaxial layer, and forming the P-doped well and two laterally spaced N+ regions in the P-doped well;

step 2: forming the photodiode in the epitaxial layer, and forming the floating diffusion node in one of the N+-doped regions which is at the side of the transfer transistor opposite to the side of the photodiode;

step 3: forming a vertical gate trench of the transfer transistor in the epitaxial layer between the photodiode and the floating diffusion node by means of etching, wherein a depth of the vertical gate trench extends to the depth where the photodiode is located, and wherein the vertical gate comprises the bottom structure including a plurality of protruding portions stretching into the epitaxial layer;

step 4: depositing a layer of polysilicon on the epitaxial layer into the vertical gate trench; and step 5: patterning the layer of polysilicon to form the vertical gate of the transfer transistor between the photodiode and the floating diffusion node, and patterning the gate of the reset transistor between the two N+-doped regions.

8. The method for manufacturing the buried tri-gate fin vertical gate structure according to claim 7, wherein in step 1, the P-doped well is formed by sequentially performing photolithography, etching, and ion implantation; and wherein the two N+-doped regions are formed by sequentially performing photolithography, etching, and N-type ion implantation.

9. The method for manufacturing the buried tri-gate fin vertical gate structure according to claim 7 wherein in step 2, the photodiode is formed by sequentially performing photolithography, etching, and ion implantation.

10. The method for manufacturing the buried tri-gate fin vertical gate structure according to claim 7, wherein the method further comprises step 6: performing ion implantation in the epitaxial layer on the photodiode to form a pinning layer.

11. The method for manufacturing a buried tri-gate fin vertical gate structure according to claim 7, wherein in step 3, the vertical cross section of two of the plurality of protruding portions into the epitaxial layer forms a shape like a letter "n".

12. The method for manufacturing the buried tri-gate fin vertical gate structure according to claim 7, wherein step 3 further comprises etching the vertical gate trench in the epitaxial layer to have a length in a range of ⅓ to ½ of a length of the vertical gate disposed in a vertical direction in the epitaxial layer.

* * * * *